(12) United States Patent
Dasgupta (10) Patent No.: US 7,592,871 B1
(45) Date of Patent: Sep. 22, 2009

(54) FULLY DIFFERENTIAL CURRENT-FEEDBACK CMOS/BIPOLAR OPERATIONAL AMPLIFIER

(75) Inventor: Uday Dasgupta, Singapore (SG)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 12/287,964

(22) Filed: Oct. 15, 2008

Related U.S. Application Data

(63) Continuation of application No. 11/788,571, filed on Apr. 20, 2007, now Pat. No. 7,439,803, which is a continuation of application No. 10/950,201, filed on Sep. 24, 2004, now Pat. No. 7,215,198.

(60) Provisional application No. 60/576,125, filed on Jun. 1, 2004.

(51) Int. Cl.
*H03F 3/45* (2006.01)

(52) U.S. Cl. ......................................... 330/258; 330/69

(58) Field of Classification Search ................ 330/258, 330/69, 126, 252
See application file for complete search history.

(56) References Cited

U.S. PATENT DOCUMENTS

| | | | |
|---|---|---|---|
| 4,331,929 A | 5/1982 | Yokoyama | ................ 330/254 |
| 5,097,223 A | 3/1992 | Alexander | |
| 5,351,012 A | 9/1994 | Toumazou | |
| 6,316,998 B1 | 11/2001 | Oikawa | ..................... 330/255 |
| 6,326,815 B1 | 12/2001 | Sim et al. | ..................... 327/57 |
| 6,429,735 B1 | 8/2002 | Kuo et al. | .................. 327/563 |
| 6,492,871 B2 | 12/2002 | Liu et al. | |
| 6,636,116 B2 * | 10/2003 | Cameron | ..................... 330/260 |
| 6,924,696 B2 * | 8/2005 | Wentink | ....................... 330/69 |
| 7,042,291 B2 * | 5/2006 | Ueno et al. | .................. 330/258 |
| 7,183,858 B2 * | 2/2007 | Pan | ............................ 330/305 |
| 7,215,198 B1 | 5/2007 | Dasgupta | |

OTHER PUBLICATIONS

Data Sheet for Intrersil's EL2120, Jan. 1996.
Mahmoud, Soliman Awad, Low Voltage Analog VLSI Circuits, Thesis Detail Sheet from Cairo University—Electronics and Communications Department, Apr. 10, 1999.
Schmid, Hanspeter, The Current-Feedback OTA, IEEE, 2001, pp. I-655-I658.
Data Sheet for Burr-Brown Products from Texas Instruments' OPA684, Low-Power, Current Feedback Operational Amplifier with Disable, 2001.
Data Sheet for Analog Devices's 800 MHz, 50mW Current Feedback Amplifier—AD8001, 2003.

* cited by examiner

*Primary Examiner*—Henry K Choe (57) ABSTRACT

A differential current amplifier circuit includes a first circuit generating a first pair of output currents based on a first input current to the differential current amplifier circuit. A second circuit generates a second pair of output currents based on a second input current to the differential current amplifier circuit. A first subtraction circuit generates a first output voltage based on a difference between one of the first pair of output currents and one of the second pair of output currents. A second subtraction circuit generates a second output voltage based on a difference between the other one of the second pair of output currents and the other one of the first pair of output currents.

13 Claims, 11 Drawing Sheets

FULLY DIFFERENTIAL CURRENT-FEEDBACK CMOS/BIPOLAR OPERATIONAL AMPLIFIER

CROSS-REFERENCE TO RELATED APPLICATIONS

This application is a continuation of U.S. patent application Ser. No. 11/788,571, filed Apr. 20, 2007, which is a continuation of U.S. patent application Ser. No. 10/950,201 filed Sep. 24, 2004 (now U.S. Pat. No. 7,215,198), which application claims the benefit of U.S. Provisional Application No. 60/576,125, filed Jun. 1, 2004. The disclosures of the above applications are hereby incorporated by reference in their entirety.

BACKGROUND OF THE INVENTION

1. Field of the Invention

The present invention relates to operational amplifiers and more particularly to fully differential current feedback operational amplifiers (CFB op amp's).

2. Background Information

Operational amplifiers have been commonly used for many years, and a particular form of operational amplifiers, current feedback operational amplifiers, have been in use for the last two decades.

Current feedback operational amplifiers have found use in high speed applications such as very fast DAC and ADC (digital to analog and analog to digital converters) and high performance video and audio applications, and the like. CFB op amp's have several circuit characteristics that separate them from standard voltage op amps, such as such a very low input impedance at least at the negative input contact (many CFB op amps have non-symmetrical input characteristics) and bandwidth that is, with some reasonable assumptions, dependent only on the value of the feedback resistance. In typical voltage op amps the bandwidth is dependent on the gain in the closed loop circuit.

A brief review of op amps will be sufficient for those familiar with the art. Voltage op amps have high input impedance, very high voltage gain, an input voltage signal (usually referred to as an error voltage), and a closed loop bandwidth that is dependent on the voltage gain. CFB op amp's have, correspondingly, very low input impedance, very high transimpedance, input current signal (often called an error current), and a closed loop bandwidth that is dependent on the value of the feedback resistor.

The independence of bandwidth and gain allows the gain of a closed feedback loop circuit to be set while largely preserving the bandwidth, as discussed below. This particular feature has prompted designers to use such CFB op amp's in high speed circuit applications where voltage op amps are usually not competitive.

The low input impedance, inter alia, renders CFB op amp's less flexible than their voltage counterparts for many applications, and so they are not as common. Moreover, CFB op amp's have been primarily expressed in bipolar components often due to the larger offset voltages of CMOS components and DC current problems in practical circuits.

Figure 4A:
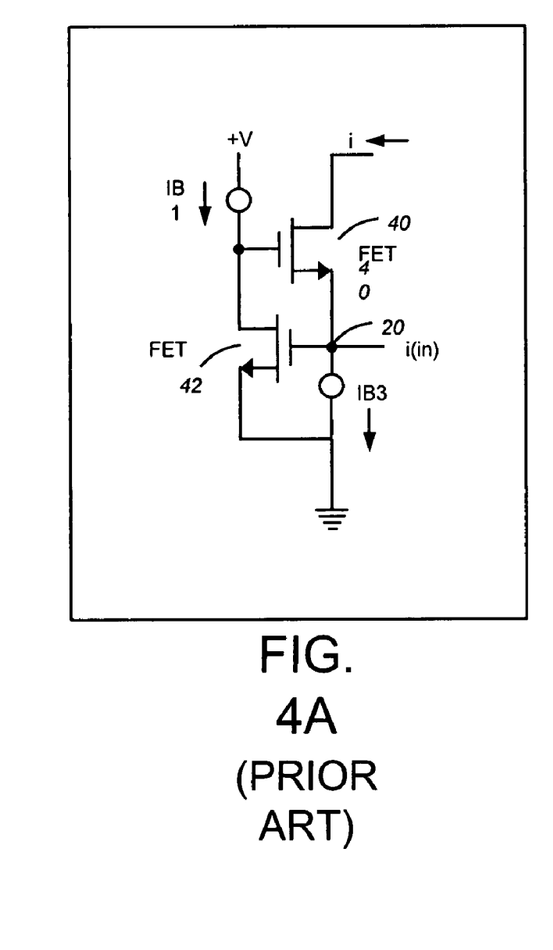
FIG. 4A is a circuit diagram of a prior art low input impedance input circuit.

For example, consider an application with power rails of ground and +2, and the low input impedance CMOS FET, shown in FIG. 4A, as the front end for an op amp. With practical components, the circuit of FIG. 4A will have a DC voltage level of about +0.5 volts at the low impedance input 20. This is a problem since the output of the op amp will most likely be set to +1 volt to approach a full +/− one volt dynamic output range. In such a case a DC current would flow through the feedback resistor, and this is usually as unacceptable as having the output quiescent voltage be +0.5 V and thereby restricting the output voltage swing.

Figure 1A:
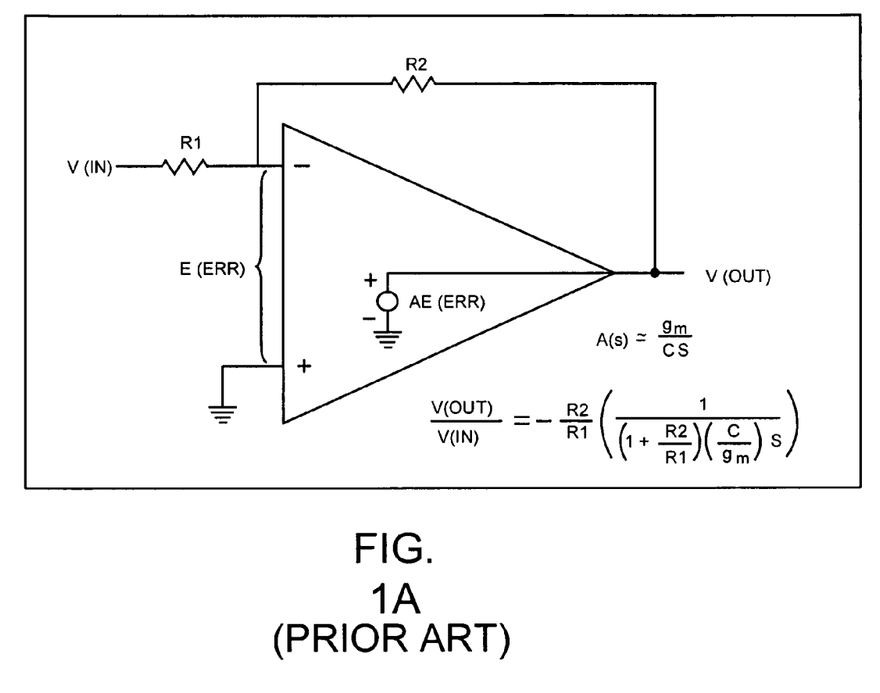
FIG. 1A is a schematic and characteristic equation of a prior art voltage op amp.
Figure 1B:
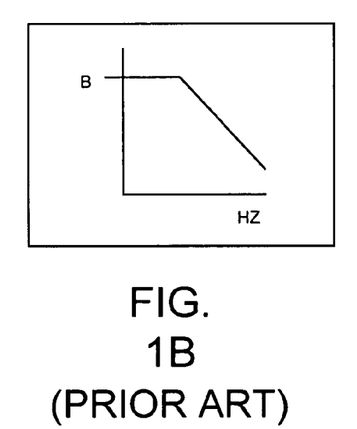
FIG. 1B, is a graph of the open circuit gain roll off of the circuit of FIG. 1A.

FIG. 1A shows the familiar voltage op amp equivalent circuit with a very high input impedance, and an error voltage e(err) that is multiplied by a large value B to produce an inverted Vout. The accompanying equation illustrates that Vout is equal to minus R2/R1 at lower frequencies (where LaPlacian term "s" is much lower than 1). The term g(m) is the transconductance of the amplifier.

Figures 2A, 2B:
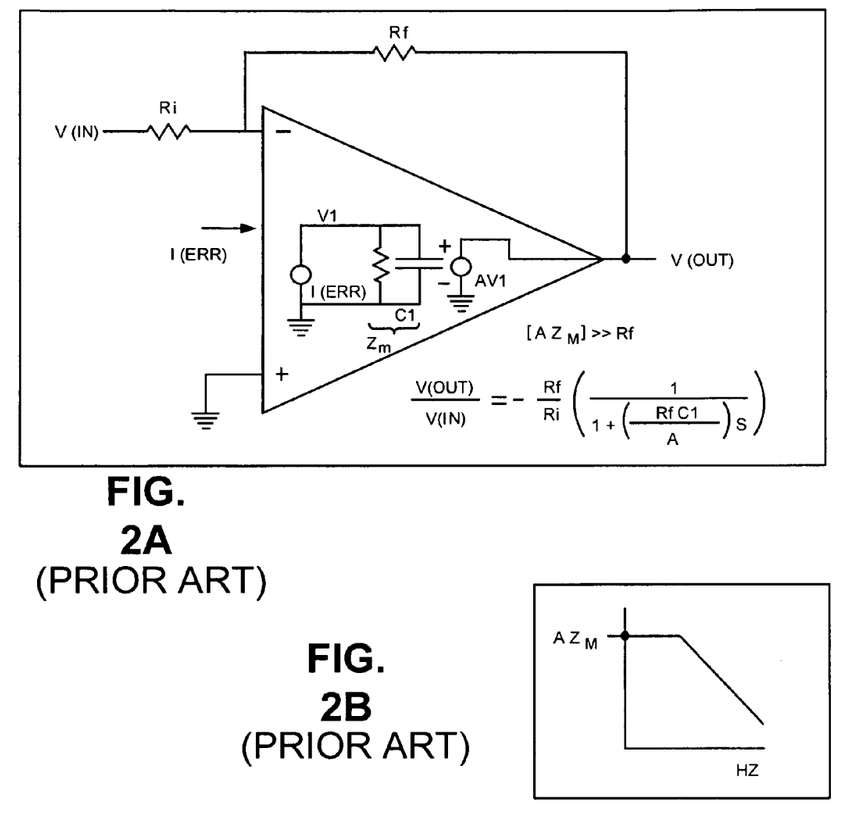
FIG. 2A, is a schematic and characteristic equation of a prior art current feedback op amp.
FIG. 2B is a graph of the open circuit roll off of the transimpedance of the circuit of FIG. 2A.

FIG. 2A shows the basic prior art equivalent circuit for a current feedback op amp, CFB op amp. Here the input impedance is low and the Vout is a function of the error current i(err) times AZm, the transimpedance of the amplifier. In this equivalent circuit v(out)=Av(in), and Av(in)=i(in)Zm, where Zm is the parallel combination of C1 and Rm (representing transresistance). So v(out)/I(in)=AZm.

FIG. 2B shows the typical one pole roll off of AZm (expressed in ohms) with frequency. This is obviously similar to the voltage op amp roll off. Like the voltage op amp gain, AZm is made very large. Also, a capacitor C1 is designed into the circuit to provide this one pole roll off, again to preserve stability. AZm includes the impedance of this capacitor C1 that has, of course, frequency dependent impedance. Importantly, the equation in FIG. 2A shows that the closed loop circuit low frequency gain is −Rf/Ri. As frequency increases (again the s term), the closed loop gain roll off is a function of Rf, the feedback resistor, the capacitor C1, and the open loop gain A, but not Ri. This indicates that the closed loop gain can be made larger by reducing Ri, in FIG. 2A, while Rf remains the same. Indeed, this is true and is well shown in the prior art.

Figure 2C:
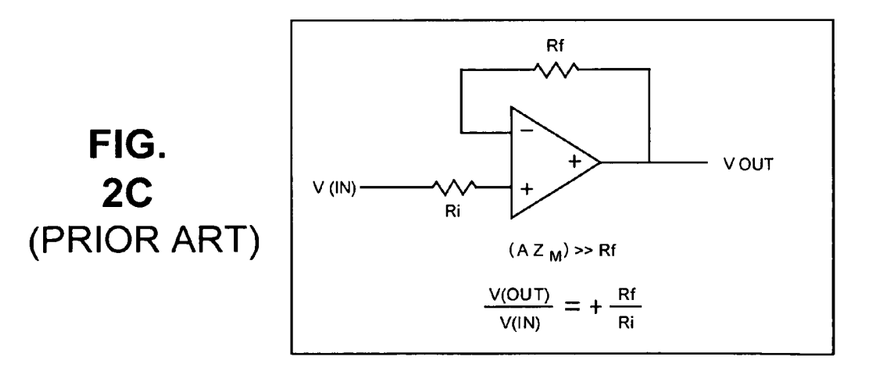
FIG. 2C is a schematic of a non-inverting application of the present invention.

FIG. 2C is a non-inverting circuit using the same current feedback op amp as in FIG. 2A. Here when the absolute value of the transimpedance Azm is large compared to Rf, the voltage gain, V(out)/V(in) is +Rf/Ri.

Figure 3A:
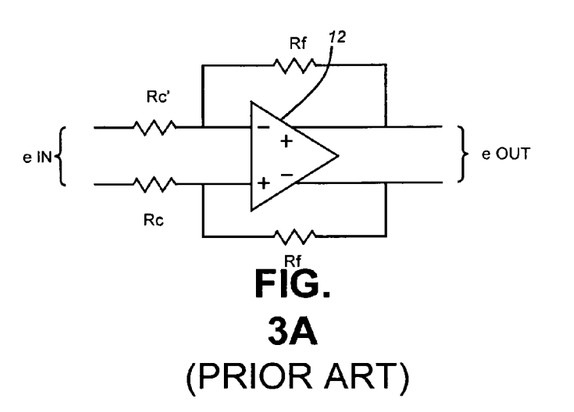
FIG. 3A is a high level block diagram circuit of a fully differential prior art CFB op amp.
Figure 3B:
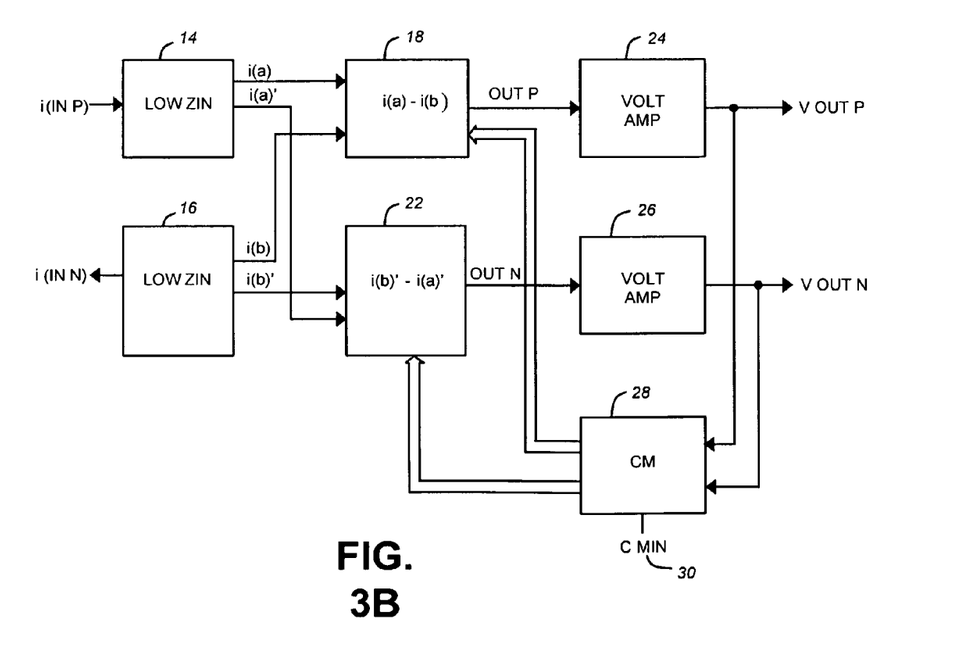
FIG. 3B is a more detailed block diagram of the inventive fully differential CFB op amp.

FIG. 3A is a known high level block that applies to the present invention, however, the present invention's circuit implementation, shown in FIG. 3B, is patently distinct.

The present invention provides a fully differential current feedback amplifier architecture, with a preferred CMOS implementation, but it may be implemented with bipolar or a hybrid circuitry as well. The preferred embodiments below are shown mainly using CMOS, but those skilled in the art will be able to incorporate the present invention in bipolar or hybrid configurations.

SUMMARY OF THE INVENTION

In view of the foregoing background discussion, the present invention provides circuitry and a corresponding process that includes a fully differential transimpedance amplifier that is suitable for use in a fully differential current feedback operational amplifier. Two low input impedance circuits accept an input differential current and two outputs provide a differential voltage output signal responsive to the differential input current.

The two low input impedance circuits each provide a current to each of a pair of current subtraction circuits. The subtraction circuits provide voltage signals that are buffered or amplified to form the voltage outputs of the fully differential amplifier.

As arranged as an operational amplifier the fully differential amplifier is designed with two input resistors that connect the input currents to the differential amplifier and feedback resistors that connect the two outputs to the low impedance inputs. The transimpedance of the fully differential amplifier is made high compared to the feedback resistor to perform as a fully differential current feedback operational amplifier.

A common mode circuit is employed that compares the average of the output voltages to a set input DC voltage and outputs currents. These currents are negatively fed back to the current subtractor circuits that drive the average to minimize the difference between the average and the set input.

The invention may be implemented with CMOS or other FET transistors, bipolar, or in heterojunction bipolar transistors (HBT), or combinations thereof.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

FIG. 3A is a block diagram that exists in the prior art. The circuit by inspection is a fully differential amplifier, that, when the transimpedance of the amplifier 12 is very high, acts as a fully differential current feedback operational amplifier with a differential gain, e(out)/e(in)=−(Rf/Ri).

FIG. 3B is a more detailed, inventive functional block diagram of an embodiment of the inventive amplifier. There are two low impedance input circuits, circuit 14 receiving i(inp) and circuit 16 receiving i(inn). Such current designations, as known to those skilled in the art, are standard conventions for currents. Either current may actually be into (positive) or out from (negative) the amplifier inputs.

Still referring to FIG. 3B, each low input impedance input stages, 14 and 16, convert the input currents to output current pairs, i(a), i(a)', and i(b), i(b)', that emanate from a higher impedance. In an embodiment, i(a) and i(b) and essentially identical to i(a)' and i(b)', respectively. The currents, i(a)'s and i(b)'s, are received by current subtracting or differencing circuits, 18 and 22. Circuit 18 subtracts i(b) from i(a), and circuit 22 subtracts i(a)' from i(b)'. The circuits 18 and 22 produce an output voltage signal, OUTp and OUTn, respectively, that is a measure of the current differences.

Still referring to FIG. 3B, the OUTP is input to a voltage amplifier 24, that outputs VOUTP and the OUTN is input to a voltage amplifier 26, that outputs VOUTN.

The CM, common mode, circuit averages the voltages of the two outputs that are fed back to the current subtraction circuits 18 and 22. The average value is compared to CMIN 30 and the negative feedback balances the average value to be equal to the CMIN level. In this way the DC output levels can be set for a particular application with specific power rails.

Specific circuitry within the circuit blocks of FIG. 3B is shown in the following FIGS. 4 through 8.

FIG. 4A is a known low input impedance circuit. The input current signal, i(in), is connected to the source of FET 40, the source being a low input impedance of about the inverse of the transconductance, gm, of the FET 40. In this instance there is also a negative feedback path via FET 42 to the gate of FET 40 that further reduces the input impedance. However, as discussed above the input node 20 in this circuit will have a DC voltage level that is different from +V/2, due to FET's 42 gate to source voltage, Vgs. This is a problem when the circuit is used as the front end of a CFB op amp because the input DC voltage level cannot be substantially changed. This particular problem is relieved in a preferred embodiment of the present invention by adding a resistor RS1, as shown in FIG. 4B.

Figure 4B:
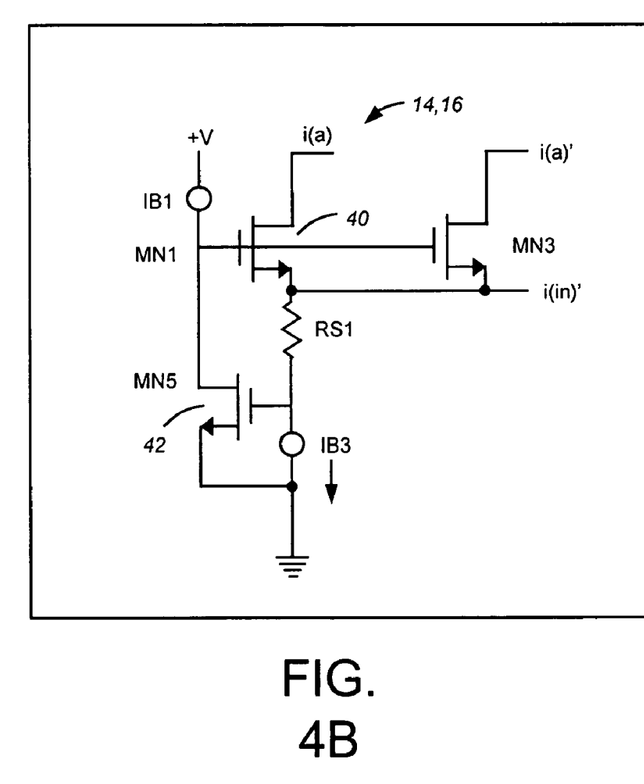
FIG. 4B is the improved low input impedance circuit diagram.

FIG. 4B is an inventive preferred input circuit where the input impedance remains the same as in the circuit 4A. There is now a DC voltage drop across RS1 that can be used to accommodate an input and/or output voltage level of +V/2 the CFB op amp, thus minimizing the DC current flow through the input and/or output resistors. FIG. 4B also provides two FET's, MN1 and MN3, preferably arranged as mirrors having the same value drain currents, i(a) and i(a)'.

Designations MP refer to p-type CMOSFET's and MN to n-types.

Figure 5:
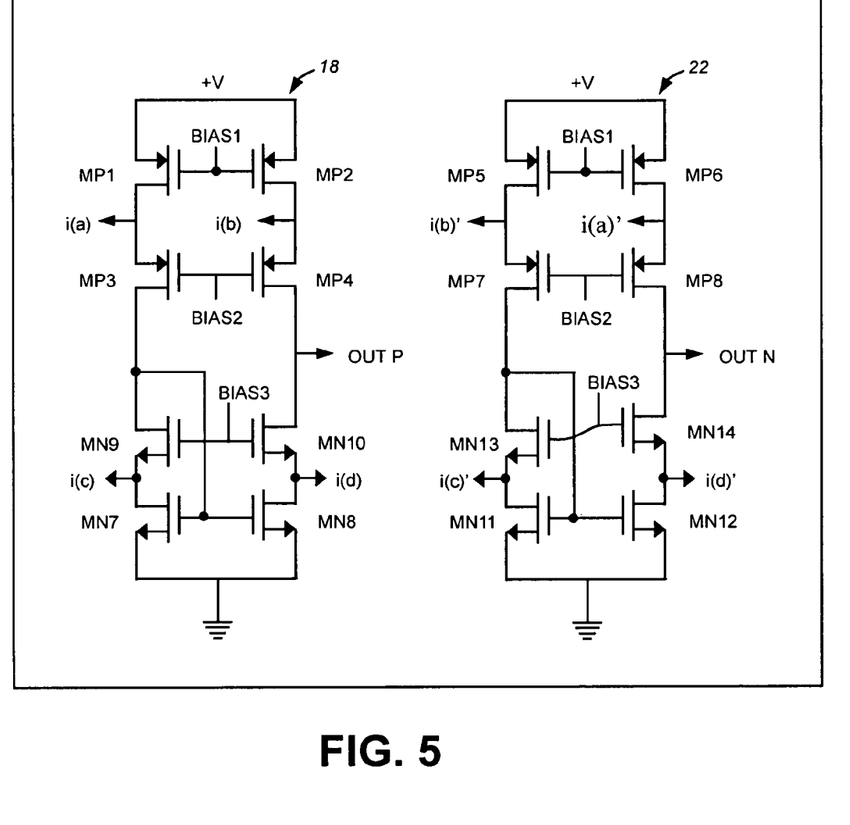
FIG. 5 is a schematic of the current subtractor circuit in FIG. 3B.

With respect to FIG. 5, MP1 and MP2 are PMOS current sources, and MP3 and MP4 are PMOS devices arranged in a cascode fashion (with respect to MN1 and MN3 of FIG. 4B) to raise their output impedances. The MP1 and MP2 current sources drive eventually into the current mirrors MN7 and MN8, that have MN9 and MN10 also arranged in a cascode fashion with respect to MN7 and MN8, respectively, which again raises their output impedances. When the signal i(a) and i(b) are introduced at the sources of MP3 and MP4 they are reproduced at the drains of MP3 and MP4 with reverse polarity in order to preserve the constant bias currents through MP1 and MP2. So the drain signal current at MP3 is −i(a) and −i(b) from the drain of MP4.

Still referring to FIG. 5, the connection from the gate of MN7 and the drain of MN9 ensures that −i(a) from the drain of MP3 will be mirrored by MN7 and at the drain of MN8 and so appear at the drain of MN10 as −i(a). The signal currents at the common drains of MN10 and MP4 will subtract resulting in an output signal current at OUT P of i(a)−i(b). This current differential will generate a voltage signal at OUT P equal to the signal current difference times the output impedance, Rmp, at OUT P.

No current is taken from OUTP, so the voltage signal at OUT P=[i(a)–i(b)]Rmp. Where Rmp is the parallel combination of the series output impedances of MP4 and MP2 and the series output impedance of MN10 and MN8. Rmp=[(gm$_{p4}$)(ro$_{p4}$)(ro$_{p2}$)]//[(gm$_{n10}$)(ro$_{n10}$)(ro$_{n8}$)]

Similarly for the voltage signal at OUT N=[i(b)'–i(a)'] Rmn. Where Rmn is the parallel combination of the series output impedances of MP8 and MP6 and the series output impedance of MN14 and MN12. Rmn=[(gm$_{p8}$)(ro$_{p8}$)(ro$_{p6}$)]//[(gm$_{n14}$)(ro$_{n14}$)(ro$_{n12}$)].

From inspection the output voltage signal at OUT P and OUT N are out of phase since i(a)=i(a)' and i(b)=i(b)'.

Figure 6:
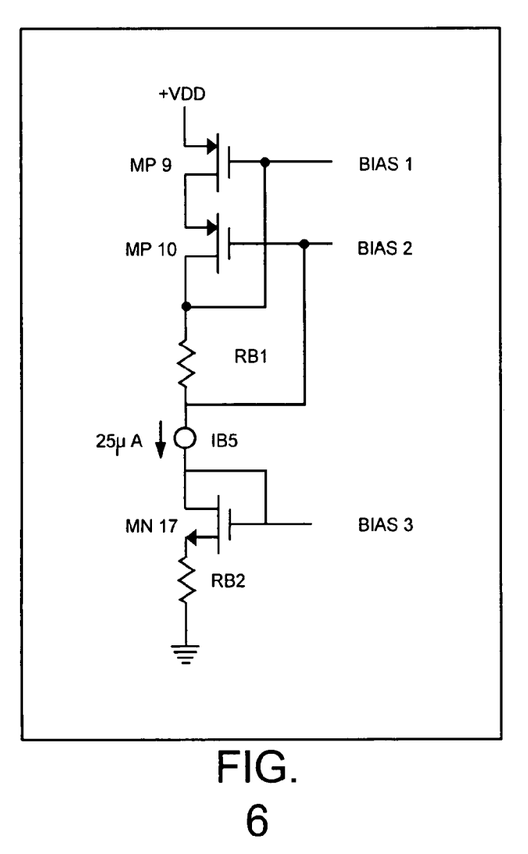
FIG. 6 shows a biasing circuit tree used in an embodiment the circuits of FIG. 3A.

FIG. 6 shows the biasing tree set up for the current subtraction circuits 18 and 22 (FIG. 3B). MP9 forms a current mirror with MP1, MP2, MP5, and MP6 (FIG. 5), since the gate to sources of all these transistors are tied to common voltage points. In a preferred embodiment MP9 is only ½ the size of mirrors MP1, MP2, MP5, and MP6, so that the current through MP9 is only ½ that of each of the four mirrors. MP10 is the same size as MP9 and RB1 provides a voltage drop so that the voltage BIAS2 to MP3, MP4, MP7, and MP8 is sufficiently lower than the BIAS1 voltage. IB5 is preferably about 25 micro amps and MP9, MP10, and MN17 are sized to accommodate the 25 micro amps. MN17 has a source resistor RB2 that provides a voltage drop so that the BIAS3 connects to the gates of current mirrors, MN9, MN10, MN13, to accommodate the voltage drops across MN7, MN8, MN11, and MN12, respectively. Implementing the individual circuit functions (not the inventive combinations shown and used herein), including the individual current sources, biasing, mirror circuits, and amplifiers are well known in the art.

Figure 7:
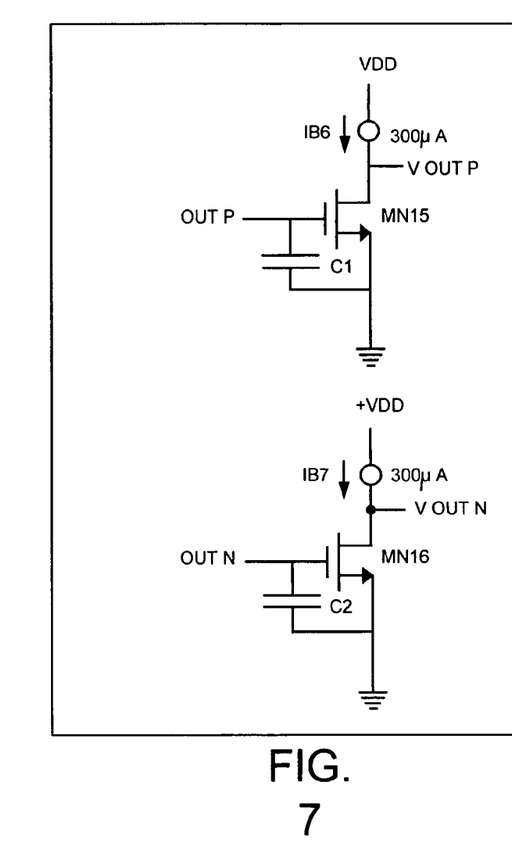
FIG. 7 shows the voltage output amplifier circuits of FIG. 3B.

FIG. 7 shows voltage amplifiers, formed by MN15 and MN16, with gates that receive the OUTP and OUTN (FIG. 5) signals and provide amplified versions at VOUTP and VOUTN. The drains connect to current sources IB6 and IB7, but RL1 and RL2 (FIG. 8) are connected between the drains. These resistors are sized so that the voltage gain, in a preferred embodiment, ranges from about five to ten, but other values may be used to advantage. MN15 and MN16 are preferably sized to accommodate current in the 300 micro amp range. C1 and C2 are used to create the one pole roll off with the output impedance of the current subtractors that extends well below the unity value of the AZm (transimpedance) of the op amp again to ensure circuit stability. These capacitors are preferably formed from poly-poly or metal-metal layers, as known in the art.

Still referring to FIG. 7, the voltage gain of MN15 is A$_1$=(gm$_{n15}$)(RL1). And that for MN16 is A$_2$=(gm$_{n16}$)(RL2). The net differential output voltage gain, Vdiff, is V OUT P–V OUT N, which is equal to A1(OUT P)–A2(OUT N). Substituting for OUT P and OUT N, the result is:

$$Vdiff=A1(i(a)-i(b))(Rmp)-A2(i(a)'-i(b)')(Rmn).$$

In an embodiment, gm$_{N15}$=gm$_{N16}$, RL1=RL2, then A1=A2=A.

Assuming Rmp=Rmn=Rmn, then Vdiff=[i(a)–i(b) i(b)'+i(a)']ARm.

Since i(a)=i(a)' and i(b)=i(b)'; Vdiff=2[i(a)–i(b)] ARm.

The resulting differential transimpedance is Vdiff/[i(a)–i(b)]=2ARm

Figure 8:
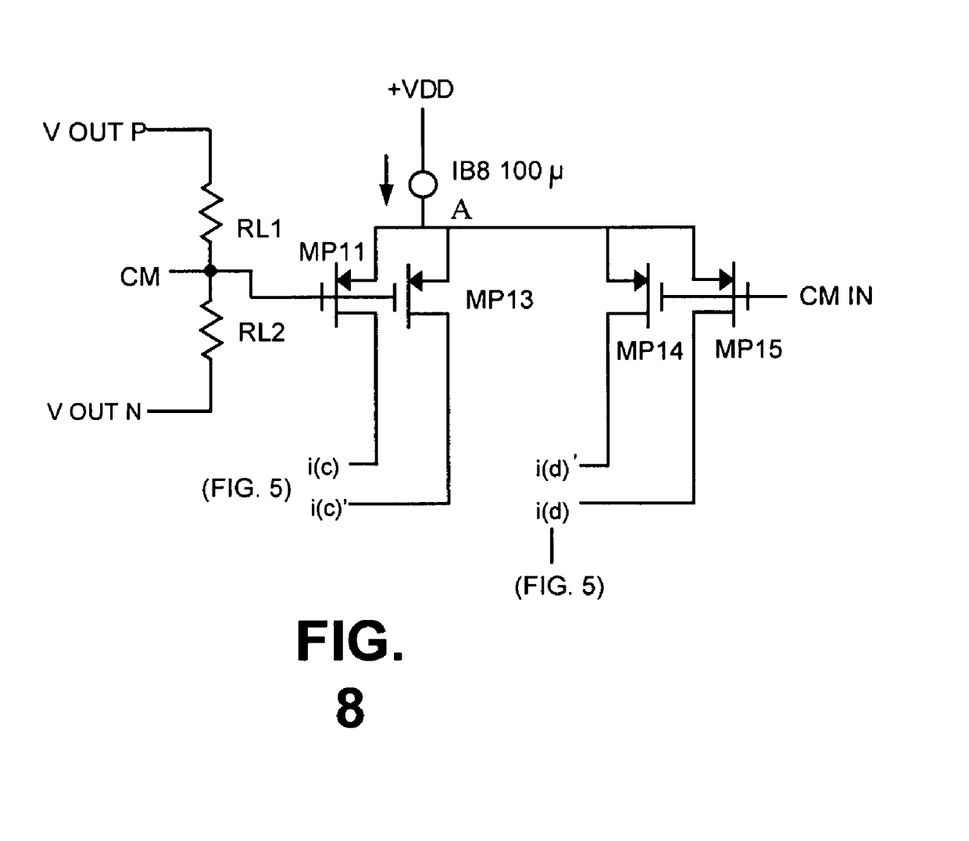
FIG. 8 shows the common mode circuit of FIG. 3B.

FIG. 8 illustrates a preferred common mode (CM) circuit that feeds back currents, i(c), i(c)', i(d), and i(d)', to the current subtracting circuits 18 and 22 (FIG. 3) to allow the output voltage DC to be set to some desired value. In an embodiment, i(c) and i(d) are essentially equal to i(c)' and i(d)', respectively. These CM currents drive into the sources of MN9, MN10, MN13, and MN14 (FIG. 5). As discussed before with respect to FIG. 5, MN7 and MN8 mirror the current from MP1, which is fixed as is the bias currents in MN7 and MN8. Since, if a CM signal current, i(d), is injected into the source of MN10 adding to the bias current, i(d) is reproduced as –i(d) at OUT P. Similarly, the signal current i(c), introduced at the source of MN9, is mirrored by MN8 and appears at OUT P as i(c). Thus both CM signal currents appear at the drain of MN10 as i(c)–i(d). As discussed before, no current is taken from OUT P so the resulting CM signal currents generate a voltage at OUT P=[i(c)–i(d)] Rmp, and similarly, the voltage signal at OUT N=[i(c)'–i(d)']Rmn. Since i(c)=i(c)' and i(d)=i (d)', the voltage signals at OUT P and OUT N are in-phase, common mode signal.

The result is that in conjunction with the amplifiers, MN15 and MN16, the CM signal currents, i(c), i(d), i(c)', and i(d)', adjust the common mode voltage at VOUT P and VOUT N to be equal to the voltage applied at CMIN.

Additionally, with external circuitry similar to that in FIG. 4B, with the drains of MN1 and MN3 connected to +V, the sources of MN1 and MN3, or a resistive voltage divider, can be arranged to provide a set DC voltage of +V/2. This set DC voltage can be applied to CMIN, FIG. 8 et seq. In this way the output voltages of the op amp will track those at the inputs to minimize the DC current flow.

Figure 12:
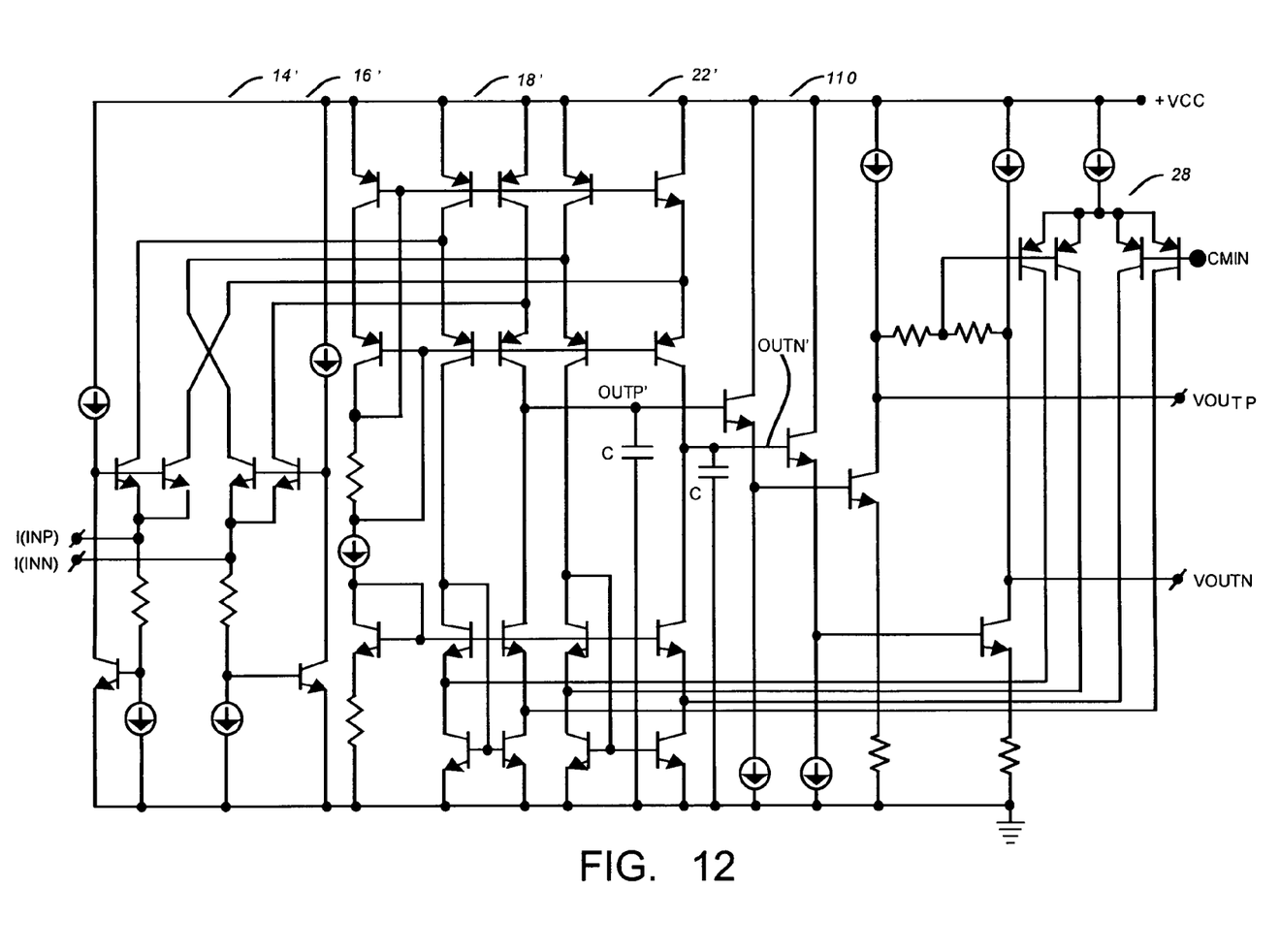
FIG. 12 is a bipolar circuit equivalent to that in FIG. 9.

The present invention can be implemented with bipolar components by those skilled in the art, as follows. Bipolar functional equivalents for the CMOS circuits of the present invention can be implemented by those skilled in the art FIG. 12 illustrates some of these circuits.

Figure 9:
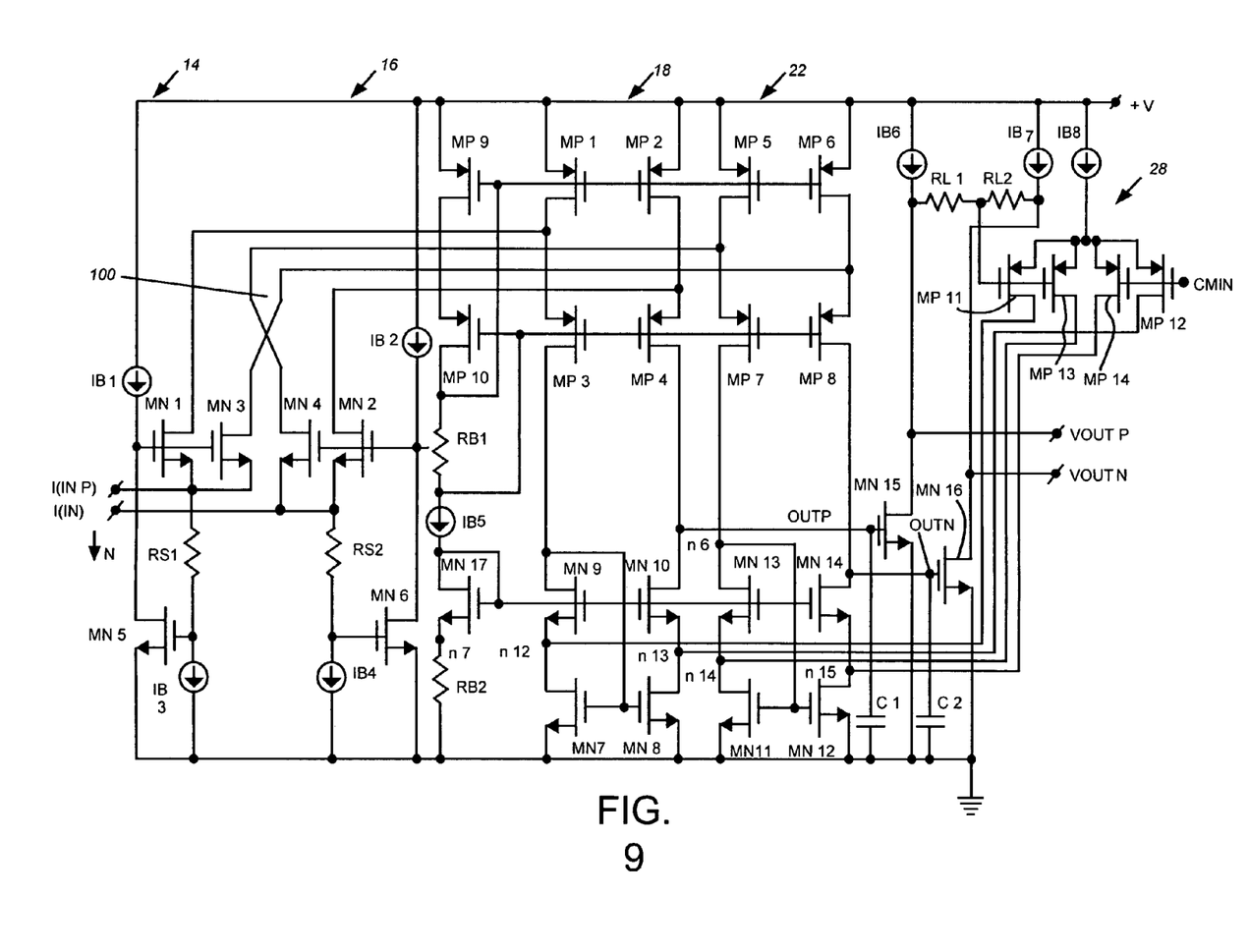
FIG. 9 is a full schematic CMOS implementation of FIG. 3B.

FIG. 9 shows a more fully developed current feedback amplifier circuit that includes the same functions, 14, 16, 18, 22, 28, and 30, as described above for FIGS. 4-8 with CMOS transistors. Note the cross over 100 where the order of the currents into the current subtractors 18 and 22 are reversed.

In simulation a closed loop bandwidth of 100 MHz can be achieved with the circuit of FIG. 9 designed with a 1 mA current consumption from a 1.8 V supply using 0.15 micro meter technology. Such an amplifier can be used for signal processing from at least DC to 100 MHz.

More specifically the various current sources used in FIG. 9 are designed as follows: IB1, IB2 and IB5 are set at 25 microAmps; IB3, IB4 at 50 microAmps; IB6 and IB& at 300 microAmps; and IB8 at 100 microAmps. The relative sizes of the transistors are as follows with respect to minimum size represented as "1" for a 25 microAmp FET in the 0.15 micro meter technology. The other sizes are specified in multiples (e.g. "×2" means times two) of this minimum size. MP9 and MP10 are ×1, and all the remaining MP's are ×2. MN5, MN6, and MN17 are ×1; MN7-MN14 are ×2; MN1-MN4 is ×5; and MN15 and MN16 are ×15.

Figure 10:
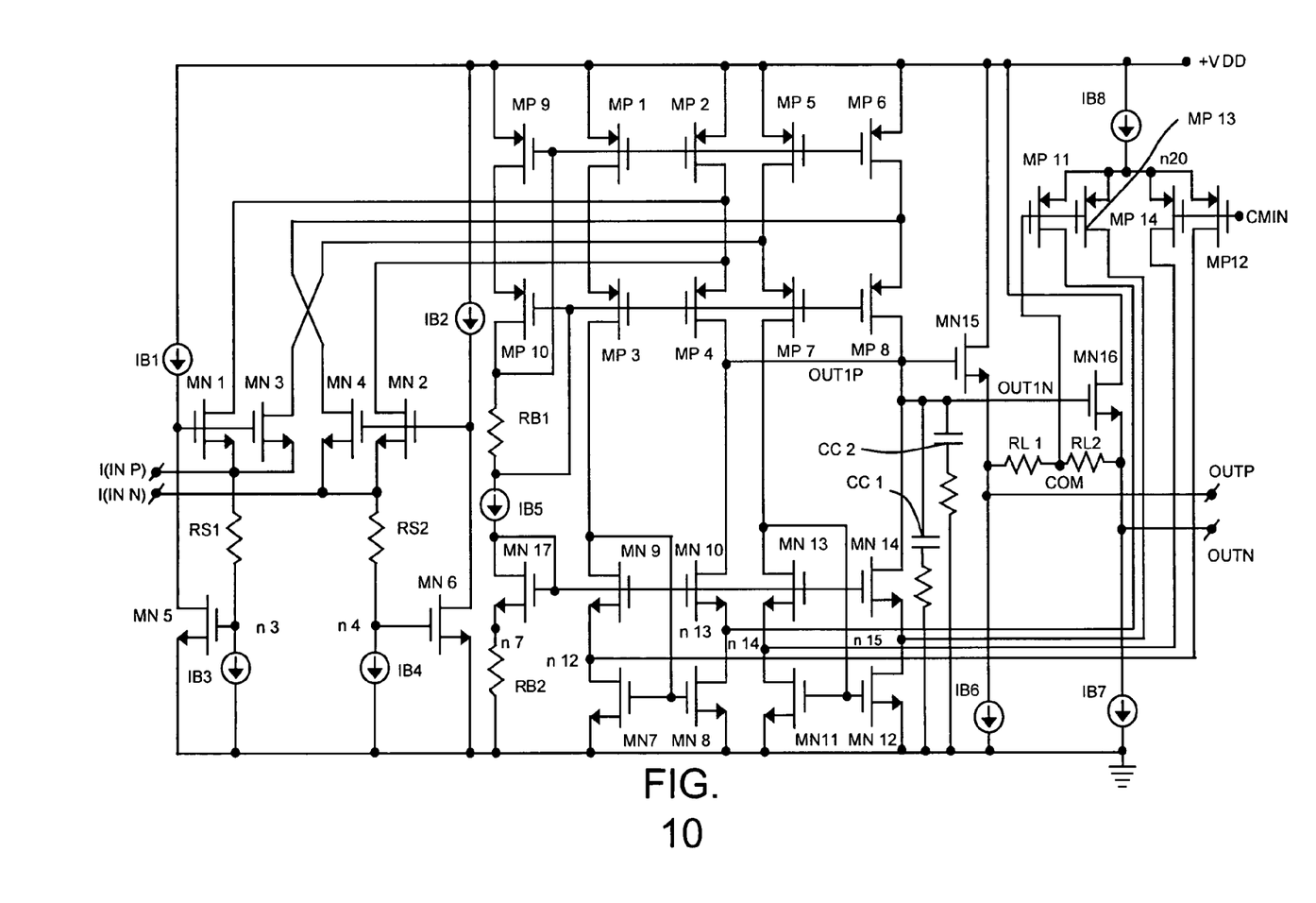
FIG. 10 is the schematic of FIG. 9 where the voltage amplifier circuits are replaced by source followers.

FIG. 10 is the circuit of FIG. 9, except the voltage amplifiers, MN15 and MN16 are now arranged as source follower circuits with the output signals taken from their sources. The net effect is that the closed loop circuit bandwidth can be made higher, to about 400 MHz with the same power consumption as in FIG. 9. The CM circuitry remains intact.

Figure 11:
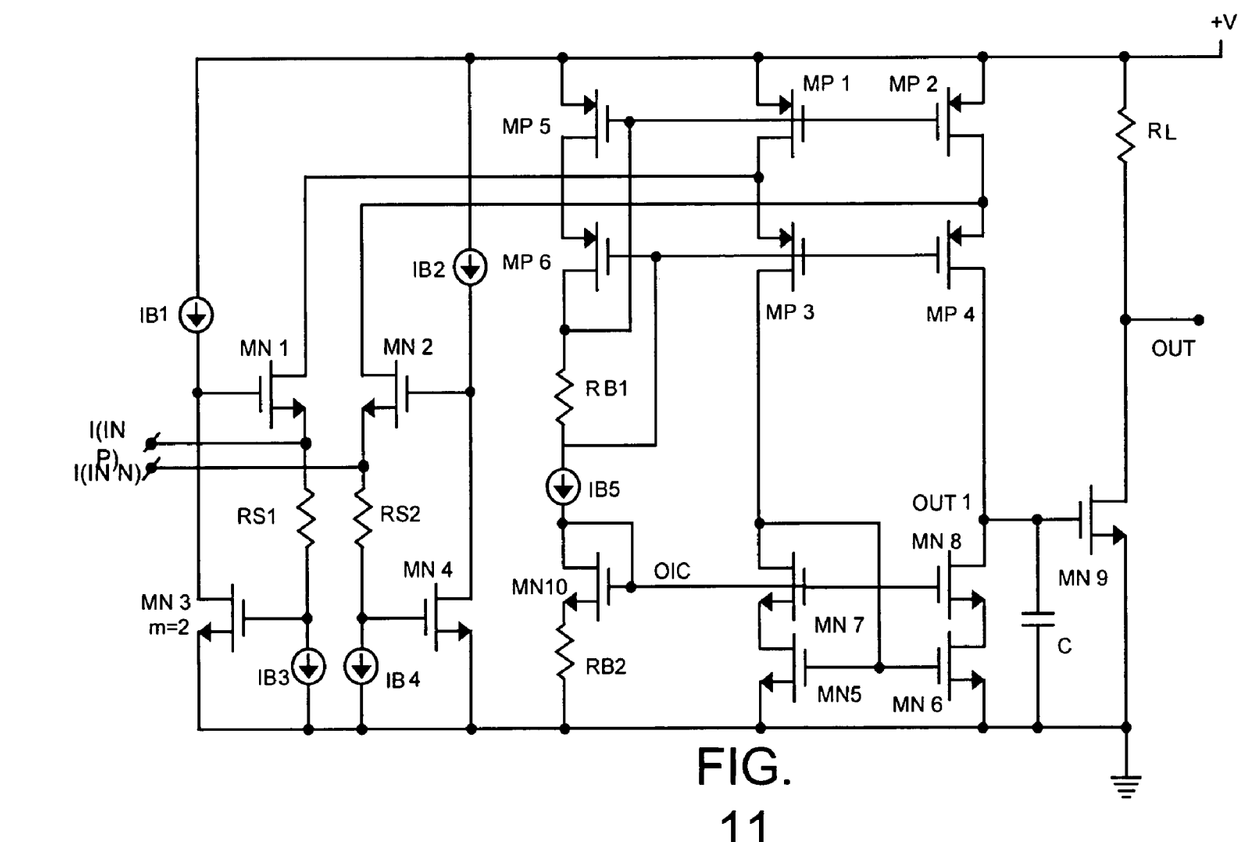
FIG. 11 is a single ended output embodiment.

FIG. 11 is a single ended output circuit with only one current subtractor and one voltage gain stage. This circuit can be used in the non-inverting CFD op amp's mentioned above.

FIG. 12 is a bipolar circuit equivalent for the circuit of FIG. 9. The functional circuits sections, 14', 16', 18', 22', and 28' perform the same functions as the un-primed CMOS circuits. In this case emitter followers 110 buffer the OUTP' and OUT N'. The capacitors C and C provide the one pole roll off.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A differential current amplifier circuit comprising:
   a first circuit that generates a first pair of output currents based on a first input current to the differential current amplifier circuit;
   a second circuit that generates a second pair of output currents based on a second input current to the differential current amplifier circuit;
   a first subtraction circuit that generates a first output voltage based on a difference between one of the first pair of output currents and one of the second pair of output currents; and
   a second subtraction circuit that generates a second output voltage based on a difference between the other one of the second pair of output currents and the other one of the first pair of output currents.

2. The differential current amplifier circuit of claim 1 further comprising:
   a first buffer that generates a first buffered output voltage based on the first output voltage; and
   a second buffer that generates a second buffered output voltage based on the second output voltage.

3. The differential current amplifier circuit of claim 1 wherein the first circuit and the second circuit have low input impedance.

4. The differential current amplifier circuit of claim 1 wherein the first circuit comprises:
   a first transistor including a first terminal that communicates with an input of the first circuit and a second terminal that outputs the one of the first pair of output currents;
   a second transistor including a second terminal that communicates with a control terminal of the first transistor; and
   a resistance that communicates with the first circuit and the control terminal of the second transistor,
   wherein the first and second transistors form a feed back circuit.

5. The differential current amplifier circuit of claim 2 wherein the first and second buffers provide a voltage gain.

6. The differential current amplifier circuit of claim 2 further comprising a common mode circuit that communicates with the first and second buffers and the first and second subtraction circuits.

7. The differential current amplifier circuit of claim 6 wherein the common mode circuit comprises:
   a first circuit that generates a first signal based on the first and second output voltages; and
   a difference amplifier that outputs first and second currents based on the first signal and a set voltage signal, and
   wherein the first and second currents are fed back to the first and second subtraction circuits.

8. A differential current amplifier circuit comprising:
   first current generating means for generating a first pair of output currents based on a first input current to the differential current amplifier circuit;
   second current generating means for generating a second pair of output currents based on a second input current to the differential current amplifier circuit;
   first subtraction means for generating a first output voltage based on a difference between one of the first pair of output currents and one of the second pair of output currents; and
   second subtraction means for generating a second output voltage based on a difference between the other one of the second pair of output currents and the other one of the first pair of output currents.

9. The differential current amplifier circuit of claim 8 further comprising:
   first buffer means for receiving the first output voltage and outputting a first buffered output voltage; and
   second buffer means for receiving the second output voltage and outputting a second buffered output voltage.

10. The differential current amplifier circuit of claim 8 wherein the first current generating means and the second current generating means have low input impedance.

11. The differential current amplifier circuit of claim 8 wherein the first and second buffer means provide a voltage gain.

12. The differential current amplifier circuit of claim 9 further comprising common mode means for generating feedback to the first and second subtraction means based on the first and second output voltages.

13. The differential current amplifier circuit of claim 12 wherein the common mode means comprises:
   first means for generating a first signal based on the first and second output voltages; and
   difference means for generating first and second currents based on the first signal and the set voltage signal,
   wherein the first and second currents are fed back to the first and second subtraction means.

* * * * *